US008892059B2

(12) United States Patent
Yang

(10) Patent No.: US 8,892,059 B2
(45) Date of Patent: Nov. 18, 2014

(54) WIRELESS COMMUNICATION CIRCUIT CAPABLE OF ADAPTIVELY ADJUSTING CIRCUIT CONFIGURATION THEREOF ACCORDING TO CHANGE IN SURROUNDINGS AND RELATED WIRELESS COMMUNICATION METHOD

(75) Inventor: Chung-Yen Yang, New Taipei (TW)

(73) Assignee: Jieng Tai International Electric Corp., Zhonghe Dist., New Taipei (TW)

( * ) Notice: Subject to any disclaimer, the term of this patent is extended or adjusted under 35 U.S.C. 154(b) by 160 days.

(21) Appl. No.: 13/559,620

(22) Filed: Jul. 27, 2012

(65) Prior Publication Data

US 2013/0029733 A1 Jan. 31, 2013

(30) Foreign Application Priority Data

Jul. 27, 2011 (TW) ............................. 100126636 A

(51) Int. Cl.
*H03C 1/52* (2006.01)
*H01Q 1/24* (2006.01)

(52) U.S. Cl.
CPC .................................... *H01Q 1/242* (2013.01)
USPC ...................... 455/107; 455/575.7; 455/575.1

(58) Field of Classification Search
CPC . H04B 17/00; H04B 1/7093; H04M 2207/18; H04W 4/02; H03H 7/40
USPC .......................................... 455/107, 120–125
See application file for complete search history.

(56) References Cited

U.S. PATENT DOCUMENTS

| | | | | |
|---|---|---|---|---|
| 5,491,715 | A * | 2/1996 | Flaxl | 375/344 |
| 7,821,273 | B2 * | 10/2010 | Van Bezooijen et al. | 324/646 |
| 8,270,914 | B2 * | 9/2012 | Pascolini et al. | 455/90.2 |
| 8,271,060 | B2 * | 9/2012 | Park et al. | 455/575.7 |
| 8,285,220 | B2 * | 10/2012 | Cha | 455/67.13 |
| 8,391,806 | B2 * | 3/2013 | Muhammad | 455/107 |
| 8,600,319 | B2 * | 12/2013 | Itkin | 455/107 |
| 8,644,779 | B2 * | 2/2014 | Shin et al. | 455/125 |
| 2005/0064914 | A1 * | 3/2005 | Gough | 455/567 |
| 2005/0245204 | A1 * | 11/2005 | Vance | 455/80 |
| 2006/0095204 | A1 * | 5/2006 | Kim | 701/211 |
| 2007/0210899 | A1 * | 9/2007 | Kato et al. | 340/310.15 |
| 2008/0055164 | A1 | 3/2008 | Zhang | |
| 2008/0181337 | A1 * | 7/2008 | Maxim | 375/340 |
| 2013/0094556 | A1 * | 4/2013 | Itkin | 375/224 |
| 2014/0009397 | A1 * | 1/2014 | Gillespie et al. | 345/163 |
| 2014/0015751 | A1 * | 1/2014 | Gillespie et al. | 345/164 |

FOREIGN PATENT DOCUMENTS

| | | |
|---|---|---|
| CN | 101512832 A | 8/2009 |
| CN | 101860377 A | 10/2010 |
| CN | 101917219 A | 12/2010 |
| TW | 200507581 | 2/2005 |
| TW | 201044800 | 12/2010 |

* cited by examiner

*Primary Examiner* — Edward Urban
*Assistant Examiner* — Max Mathew
(74) *Attorney, Agent, or Firm* — Winston Hsu; Scott Margo

(57) ABSTRACT

A wireless communication circuit includes a sensing unit, a control unit and a wireless communication unit. The sensing unit is for detecting existence of a surrounding object, to generate a sensing signal. The control unit is coupled to the sensing unit, for generating a control signal according to the sensing signal. The wireless communication unit is coupled to the control unit, for adaptively adjusting a circuit configuration of the wireless communication unit according to the control signal.

6 Claims, 3 Drawing Sheets

WIRELESS COMMUNICATION CIRCUIT CAPABLE OF ADAPTIVELY ADJUSTING CIRCUIT CONFIGURATION THEREOF ACCORDING TO CHANGE IN SURROUNDINGS AND RELATED WIRELESS COMMUNICATION METHOD

BACKGROUND OF THE INVENTION

1. Field of the Invention

The disclosed embodiments of the present invention relate to wireless communication, and more particularly, to a wireless communication circuit capable of adaptively adjusting a circuit configuration of the wireless communication circuit according to a change in the surroundings and related wireless communication method.

2. Description of the Prior Art

Along with technology advance, a mobile phone has become one indispensable element in our daily life. When the mobile phone is in use, the communication quality is determined by antenna design of the mobile phone. Generally speaking, an antenna circuit of most modern mobile phones is integrated with a back lid of the mobile phones, in order to save circuit areas, and gain more antenna space for higher antenna radiation efficiency.

However, since an antenna is an element that is more sensitive than other elements, a surrounding change can easily cause an effect on the antenna. For example, a human hand often possesses static electricity, and thus when a user holds a mobile phone, the static electricity will cause changes of electric charges stored therein and therefore affect equivalent surrounding dielectric constant, resulting in changes of matching characteristics of the antenna circuit and accordingly causing shift on the working frequency band of the antenna circuit. As a result, the signal transmission quality is degraded.

Therefore, how to avoid the matching characteristics of the antenna circuit from changing when the user holds the mobile phone and thus touches/approaches the back lid of the mobile phone is an important problem which needs to be solved in this field.

SUMMARY OF THE INVENTION

In accordance with exemplary embodiments of the present invention, a wireless communication circuit capable of adaptively adjusting a circuit configuration of the wireless communication circuit according to a change in the surroundings and related wireless communication method are proposed to solve the above-mentioned problem.

According to a first aspect of the present invention, an exemplary wireless communication circuit is disclosed. The exemplary wireless communication circuit includes a sensing unit, a control unit and a wireless communication unit. The sensing unit is for detecting existence of a surrounding object, to generate a sensing signal. The control unit is coupled to the sensing unit, for generating a control signal according to the sensing signal. The wireless communication unit is coupled to the control unit, for adaptively adjusting a circuit configuration of the wireless communication unit according to the control signal.

According to a second aspect of the present invention, an exemplary wireless communication method is disclosed. The exemplary wireless communication method includes: detecting existence of a surrounding object to generate a sensing signal; generating a control signal according to the sensing signal; and adaptively adjusting a circuit configuration of a wireless communication unit according to the control signal.

The present invention provides a wireless communication circuit and method capable of adaptively adjusting a circuit configuration by detecting whether a handheld electronic device is touched/approached by an object which can change characteristics of a matching circuit of the handheld electronic device, to thereby adaptively adjust a configuration of the communication circuit. The working frequency band of the handheld electronic device is avoided from shifting, thus preventing degradation of the communication quality. In this way, the signal transmission performance is improved greatly.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to.". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
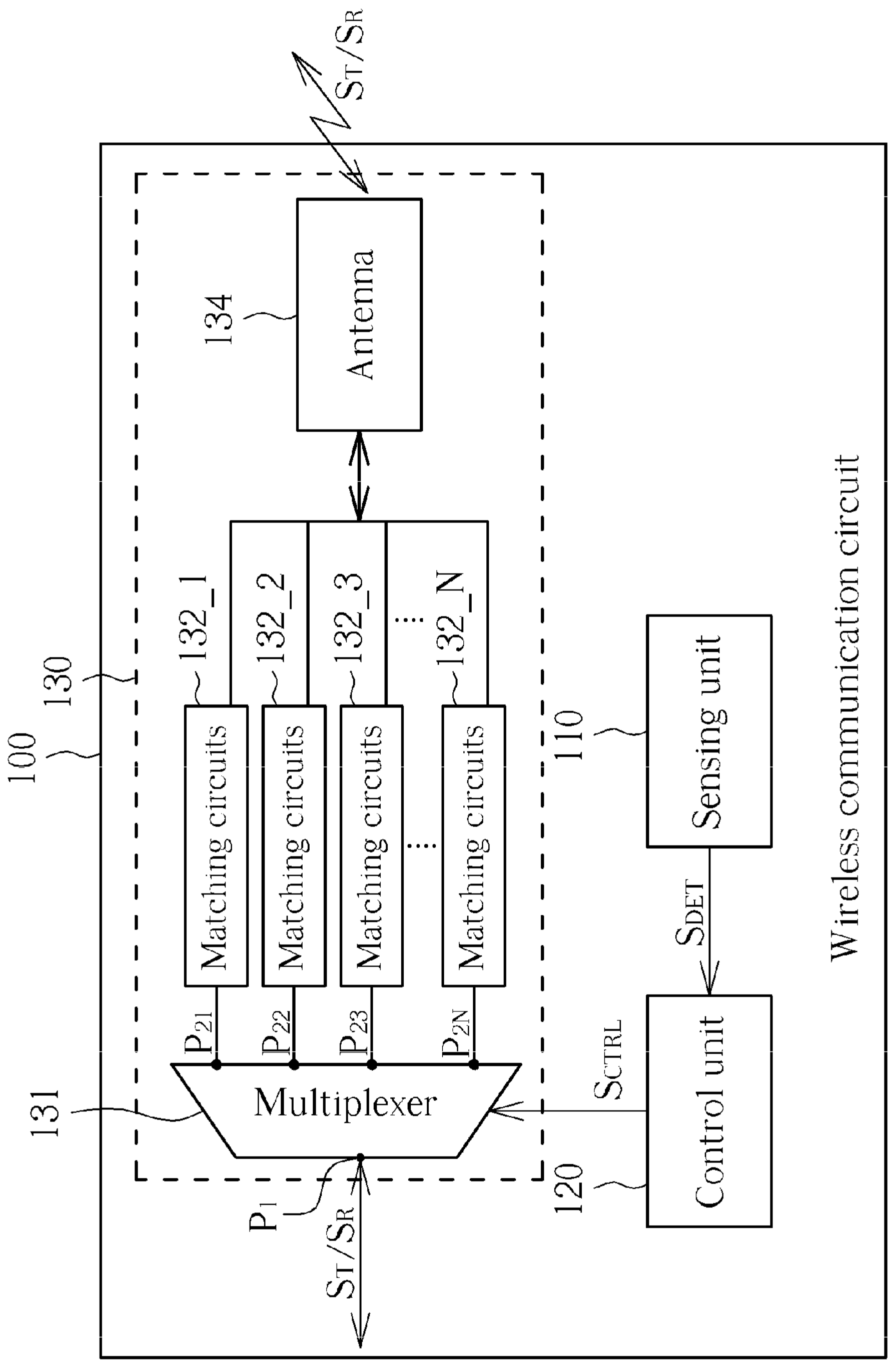
FIG. 1 is a schematic diagram of a wireless communication circuit according to an embodiment of the present invention.

Please refer to FIG. 1, which is a schematic diagram of a wireless communication circuit 100 according to an embodiment of the present invention. The wireless communication circuit 100 may be disposed in a handheld electronic device, such as a mobile phone. As shown in FIG. 1, the wireless communication circuit 100 includes, but not limited to, a sensing unit 110, a control unit 120 and a wireless communication unit 130. The sensing unit 110 may be a capacitive sensing chip utilized for detecting existence of an object in the surrounding of the wireless communication circuit 100 and accordingly generating a sensing signal $S_{DET}$. The object mentioned herein may be any object capable of triggering the capacitive sensing chip, such as an object having static electricity (e.g., a hand) or an object capable of being charged by induction (e.g., a metal). However, it is for illustrative purposes only, and not meant to be a limitation of the present invention. That is, any circuit element which can detect existence of the object in the surroundings and accordingly generate the sensing signal may be used to implement the sensing unit 110. The control unit 120 is coupled to sensing unit 100, and used for generating a control signal $S_{CTRL}$ according to the sensing signal $S_{DET}$.

The wireless communication unit 130 is coupled to the control unit 120, and used for adaptively adjusting a circuit configuration of the wireless communication unit 130 according to the control signal $S_{CTRL}$. In other words, in this embodiment, the circuit configuration of the wireless communication unit 130 is not fixed. That is, the circuit configuration of the wireless communication unit 130 is adjustable. For example, the wireless communication unit 130 can adjust the circuit configuration by switching between different matching circuits. In this embodiment, the wireless communication unit 130 includes, but not limited to, a multiplexer 131, a plurality of matching circuits 132_1-132_N and an antenna 134. Please note that, the number of the matching circuits 132_1-132_N may be adjusted based on actual design requirements. For example, the number of the matching circuits 132_1-132_N may be 2, i.e., N=2. The multiplexer 131 has a first port P1 and a plurality of second ports P21-P2N. The matching circuits 132_1-132_N are respectively coupled to the second ports $P_{21}$-$P_{2N}$, and the antenna 134 is concurrently coupled to the matching circuits 132_1-132_N. When the wireless communication circuit 100/the wireless communication unit 130 operates in a signal transmission mode, the first port P1 is arranged to receive a transmission signal, e.g., an RF signal ST, and the multiplexer 131 couples a first port $P_1$ to a specific port of the second ports $P_{21}$-$P_{2N}$ according to the control signal $S_{CTRL}$. Since the matching circuits 132_1-132_N are respectively coupled to second ports $P_{21}$-$P_{2N}$, the operation of the multiplexer 131 can be considered as determining which one of the matching circuits 132_1-132_N should be used by referring to the control signal $S_{CTRL}$. In this way, the circuit configuration of the wireless communication unit 130 can be adjusted. Thus, the multiplexer 131 can transmit the transmission signal $S_T$ to the antenna 134 via a specific matching circuit (e.g., 132_1) coupled to the specific port (e.g., P21). Finally, the antenna 134 transmits the transmission signal ST via radio.

Similarly, under the same conception, when the wireless communication circuit 100/the wireless communication unit 130 operates in a signal reception mode, at this moment, the wireless communication unit 130 utilizes the antenna 134 to receive a reception signal $S_R$, and the multiplexer 131 selects the signal path to make the reception signal $S_R$ transmitted to the first port $P_1$ via the specific matching circuit (e.g., 132_1). As those skilled in the art can readily understand the transmission process of the reception signal $S_R$ by referring to the above-mentioned paragraphs, detailed description is omitted here for brevity.

Figure 2:
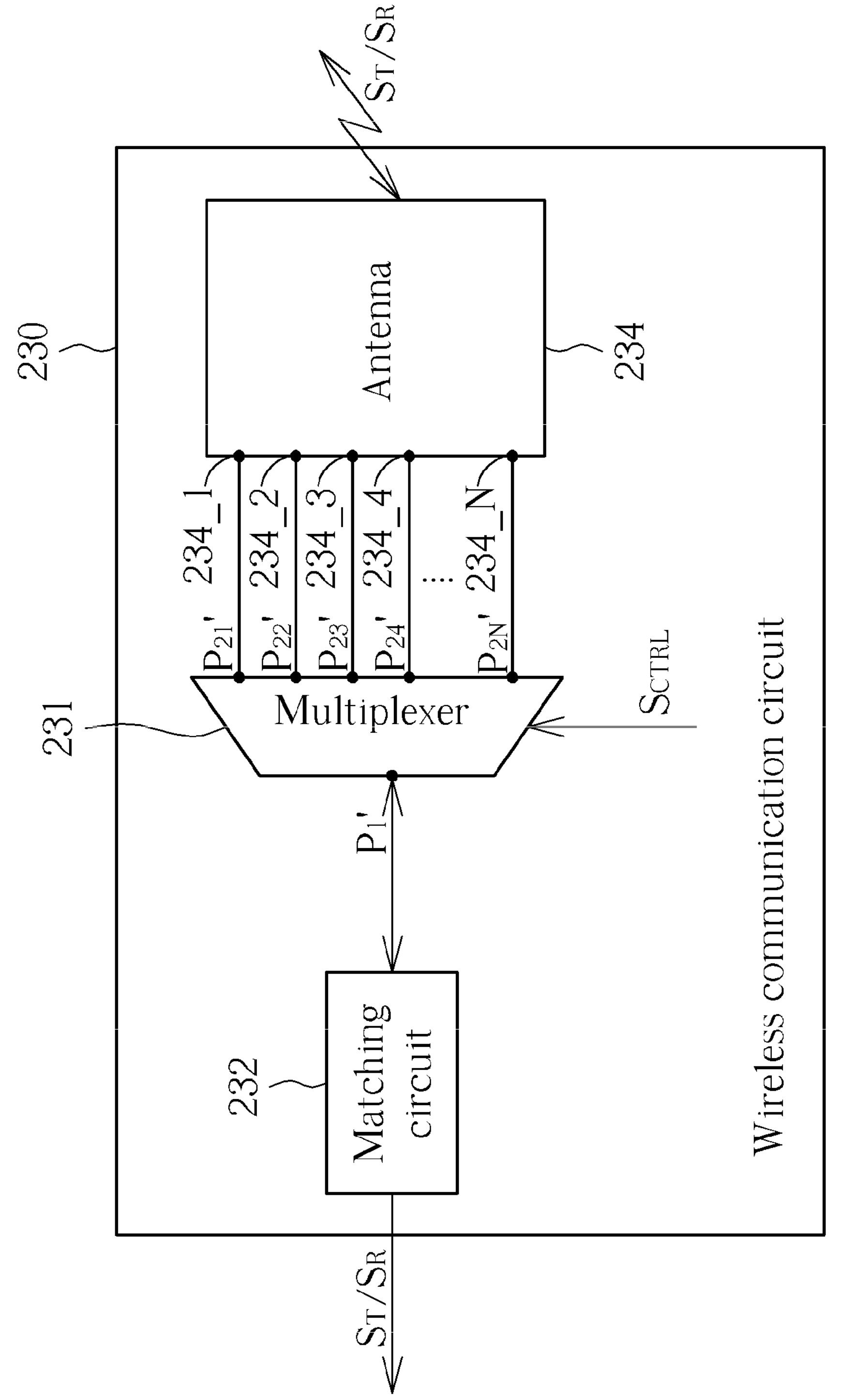
FIG. 2 is a schematic diagram of another embodiment of the wireless communication unit shown in FIG. 1 according to the present invention.

In addition, the present invention may adjust the circuit configuration of the wireless communication unit by switching between different feeding points of the antenna. Please refer to FIG. 2, which is a schematic diagram of another embodiment of the wireless communication unit shown in FIG. 1 according to the present invention. In this embodiment, the wireless communication unit 230 includes, but not limited to, a multiplexer 231, a matching circuit 232 and an antenna 234. The multiplexer 231 has a first port $P_1$' and a plurality of second ports $P_{21}$'-$P_{2N}$', where the first port $P_1$' is coupled to the matching circuit 232. In addition, the antenna 234 has a plurality of feeding points 234_1-234_N coupled to the second ports $P_{21}$'-$P_{2N}$', respectively. Please note that, the number of the feeding points 234_1-234_N may be adjusted based on actual design requirements. For example, the number of the feeding points 234_1-234_N may be 2, i.e., N=2. Since the feeding points 234_1-234_N are coupled to the second ports P21'~P2N', respectively, the operation of the multiplexer 231 may be considered as determining which one of the feeding points 234_1-234_N should be used by referring to the control signal $S_{CTRL}$. In this way, the circuit configuration of the wireless communication unit 230 can be adjusted.

When the wireless communication unit 230 operates in a signal transmission mode, the first port $P_1$' would receive the transmission signal $S_T$ transmitted from the matching circuit 232, and the multiplexer 231 couples the first port $P_1$' to a specific port of the second ports $P_{21}$'-$P_{2N}$' according to the control signal $S_{CTRL}$, such that the transmission signal $S_T$ is transmitted to the antenna 234 via a specific feeding point (e.g., 234_1) coupled to the specific port (e.g., P21'). Finally, the antenna 234 transmits the transmission signal $S_T$ via radio.

Similarly, under the same conception, when the wireless communication unit 230 operates in a signal reception mode, at this moment, the wireless communication unit 230 utilizes the antenna 234 to receive a reception signal $S_R$, and the multiplexer 231 selects the signal path to make the reception signal $S_R$ transmitted to the first port $P_1$' via the specific feeding point (e.g., 234_1). As those skilled in the art can readily understand the transmission process of the reception signal $S_R$ by referring to the above-mentioned paragraphs, detailed description is omitted here for brevity.

It should be noted that, the above-mentioned embodiments of switching between the matching circuits or the feeding points are for illustrative purposes only, and not meant to be limitations of the present invention. In a case where the spirit of the present invention is obeyed, any mechanism which can change the circuit configuration of the wireless communication unit based on the sensing signal $S_{DET}$ generated by the sensing unit 110 should fall into the scope of the present invention. In addition, the number of the matching circuits/feeding points may be adjusted according to design requirements. For example, when the control unit 120 only determines existence of surrounding object(s) according to the sensing signal $S_{DET}$ for configuring the control signal $S_{CTRL}$, i.e., the control signal $S_{CTRL}$ only has two control values, the number of the matching circuits/feeding points may be 2, i.e., the circuit configuration of the wireless communication unit 130/230 only has two options. However, when the control unit 120 is arranged to configure the control signal $S_{CTRL}$ according to the magnitude of the sensing signal $S_{DET}$, i.e., the control signal $S_{CTRL}$ has more than two control values, the number of the matching circuits/feeding points may be greater than 2, i.e., the circuit configuration of the wireless communication unit 130/230 has more than two options. Such an alternative design also obeys the spirit of the present invention and should therefore fall into the scope of the present invention.

Figure 3:
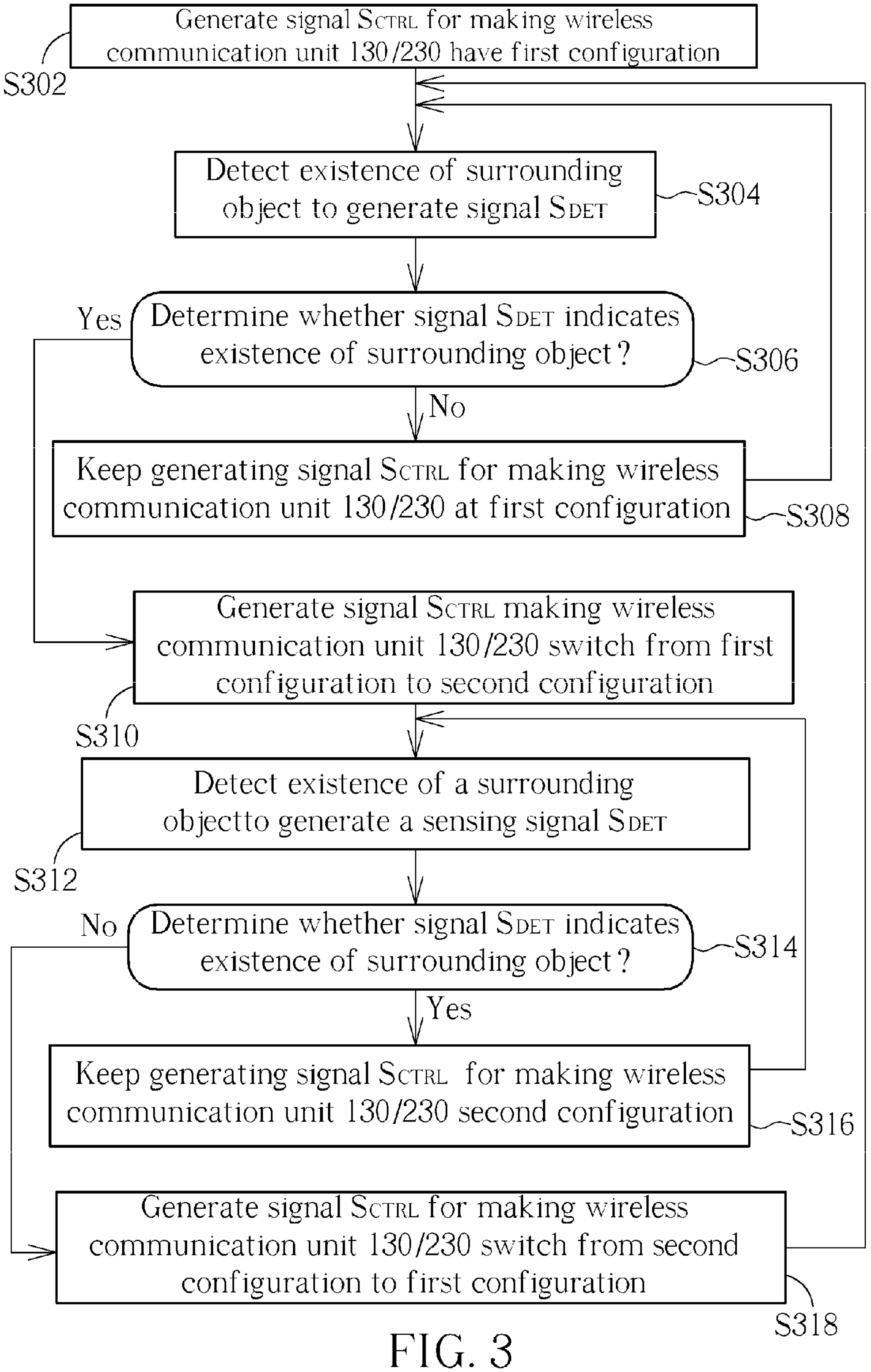
FIG. 3 is a flowchart of a wireless communication method according to an embodiment of the present invention.

In order to more elaborately illustrate related operations of the wireless communication circuit 100, please refer to FIG. 3, which is a flowchart of a wireless communication method according to an embodiment of the present invention. The wireless communication method includes, but not limited to, the following steps. Please note that if the result is substantially the same, these steps are not required to be executed in the exact order shown in FIG. 3. In addition, it is assumed that the circuit configuration of the wireless communication unit 130/230 only has two options for simplicity.

Step S302: Generate a control signal $S_{CTRL}$ having a first control value for making the wireless communication unit 130/230 have a first circuit configuration. At this moment, the working frequency band of the antenna 134 is the originally designed frequency band.

Step S304: Detect existence of a surrounding object (e.g., an interference source such as a user's hand or a metal object) to generate a sensing signal $S_{DET}$.

Step S306: Determine whether the sensing signal $S_{DET}$ indicates the existence of the surrounding object. If yes, go to step S310; otherwise, go to step S308.

Step S308: Keep generating the control signal $S_{CTRL}$ having the first control value for making the wireless communication unit 130/230 maintained at the first circuit configuration. Next, go to step S304 to continue detecting the existence of the surrounding object.

Step S310: Generate the control signal $S_{CTRL}$ having a second control value for making the wireless communication unit 130/230 switch from the first circuit configuration to the second circuit configuration. At this moment, the working frequency band of the antenna 134 shifted due to the surrounding object (e.g., the working frequency shifted toward a lower frequency band) is moved to the originally designed frequency band such that the normal signal transceiving operation is recovered.

Step S312: Detect existence of a surrounding object (e.g., an interference source such as a user's hand or a metal object) to generate a sensing signal $S_{DET}$.

Step S314: Determine whether the sensing signal $S_{DET}$ indicates the existence of the surrounding object. If yes, go to step S316; otherwise, go to step S318.

Step S316: Keep generating the control signal $S_{CTRL}$ having the second control value for making the wireless communication unit 130/230 maintained at the second circuit configuration. Next, go back to step S312 to continue detecting the existence of the surrounding object.

Step S318: Generate the control signal $S_{CTRL}$ having the first control value for making the wireless communication unit 130/230 switch from the second circuit configuration to the first circuit configuration. Next, go back to step S304.

The steps S302, S306, S308, S310, S314, S316, and S318 are executed by the control unit 120, while the steps S304 and S312 are executed by the sensing unit 110. In short, the wireless communication method includes following steps: detecting existence of a surrounding object so as to generate a sensing signal; generating a control signal according to the sensing signal; and adaptively adjusting a circuit configuration of a wireless communication unit according to the control signal.

Note that, the steps of the above-mentioned process are only a feasible embodiment of the present invention, and not meant to be limitations of the present invention. In a case where the spirit of the present invention is obeyed, the above-mentioned method may be modified to include other intermediate steps or combine several steps into one step.

To sum up, the present invention provides a wireless communication circuit and method capable of adaptively adjusting a circuit configuration by detecting whether a handheld electronic device is touched/approached by an object which can change characteristics of a matching circuit of the handheld electronic device, to thereby adaptively adjust a configuration of the communication circuit. The working frequency band of the handheld electronic device is avoided from shifting, thus preventing degradation of the communication quality. In this way, the signal transceiving performance is improved greatly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless communication circuit, comprising:

a sensing unit, for detecting existence of a surrounding object, to generate a sensing signal;

a control unit, coupled to the sensing unit, for generating a control signal according to the sensing signal; and a wireless communication unit, coupled to the control unit, for adaptively adjusting a circuit configuration of the wireless communication unit according to the control signal, the wireless communication unit comprising:

a multiplexer, having a first port and a plurality of second ports, wherein the first port is arranged to receive a transmission signal, and the multiplexer is arranged to couple the first port to a specific port of the plurality of second ports according to the control signal;

a plurality of matching circuits, respectively coupled to the plurality of second ports; and an antenna, coupled to the plurality of matching circuits, for receiving a reception signal, wherein the first port outputs the reception signal transmitted by a specific matching circuit coupled to the specific port included in the plurality of matching circuits, and the antenna transmits the transmission signal transmitted by the specific matching circuit, the antenna having a plurality of feeding points respectively coupled to the plurality of second ports, the antenna arranged for transmitting the transmission signal received by a specific feeding point coupled to the specific port included in the plurality of feeding points, and the specific matching circuit outputs the reception signal received by the specific feeding point coupled to the specific port included in the plurality of feeding points.

2. The wireless communication circuit of claim 1, wherein the sensing unit is a capacitive sensing chip.

3. The wireless communication circuit of claim 1, being disposed on a handheld electronic device.

4. The wireless communication circuit of claim 3, wherein the handheld electronic device is a mobile phone.

5. A wireless communication method, comprising:

detecting existence of a surrounding object to generate a sensing signal;

generating a control signal according to the sensing signal; and adaptively adjusting a circuit configuration of a wireless communication unit with a wireless communication unit according to the control signal, the wireless communication unit comprising:

a multiplexer, having a first port and a plurality of second ports, wherein the first port is arranged to receive a transmission signal, and the multiplexer is arranged to couple the first port to a specific port of the plurality of second ports according to the control signal;

a plurality of matching circuits, respectively coupled to the plurality of second ports; and an antenna, coupled to the plurality of matching circuits, for receiving a reception signal, wherein the first port outputs the reception signal transmitted by a specific matching circuit coupled to the specific port included in the plurality of matching circuits, and the antenna transmits the transmission signal transmitted by the specific matching circuit, the antenna having a plurality of feeding points respectively coupled to the plurality of second ports, the antenna arranged for transmitting the transmission signal received by a specific feeding point coupled to the specific port included in the plurality of feeding points, and the specific matching circuit outputs the reception signal received by the specific feeding point coupled to the specific port included in the plurality of feeding points.

6. The wireless communication method of claim 5, being employed by a mobile phone.

* * * * *